(12) United States Patent
Skliar

(10) Patent No.: US 8,521,471 B2
(45) Date of Patent: Aug. 27, 2013

(54) MEASUREMENT OF THICKNESS OF DIELECTRIC FILMS ON SURFACES

(75) Inventor: Mikhail Skliar, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 805 days.

(21) Appl. No.: 12/280,023

(22) PCT Filed: Mar. 24, 2007

(86) PCT No.: PCT/US2007/064868
§ 371 (c)(1),
(2), (4) Date: Apr. 14, 2010

(87) PCT Pub. No.: WO2007/112328
PCT Pub. Date: Oct. 4, 2007

(65) Prior Publication Data
US 2010/0198554 A1    Aug. 5, 2010

Related U.S. Application Data

(60) Provisional application No. 60/743,771, filed on Mar. 24, 2006, provisional application No. 60/743,814, filed on Mar. 27, 2006.

(51) Int. Cl.
*G01R 27/00* (2006.01)
*G01R 27/04* (2006.01)
*G01R 27/26* (2006.01)
*G01B 5/04* (2006.01)
*G01B 11/06* (2006.01)

(52) U.S. Cl.
USPC ............. 702/170; 702/65; 324/635; 324/662; 324/671; 324/699; 324/716

(58) Field of Classification Search
USPC ............... 702/65, 170; 324/635, 662, 671, 324/699, 716
See application file for complete search history.

(56) References Cited

U.S. PATENT DOCUMENTS

| | | |
|---|---|---|
| 5,353,802 A | 10/1994 | Ollmar |
| 5,621,400 A | 4/1997 | Corbi |
| 6,380,747 B1 | 4/2002 | Goldfine et al. |
| 6,384,611 B1 | 5/2002 | Wallace et al. |

OTHER PUBLICATIONS

International Search Report and Written Opinion from PCT/US2007/064868 dated Feb. 12, 2008.

*Primary Examiner* — Janet Suglo
(74) *Attorney, Agent, or Firm* — Workman Nydegger

(57) ABSTRACT

A system and method by which thickness of a dielectric film on substrates can be noninvasively determined is invented. The system and method are especially applicable to areas and applications where traditional techniques have proven unsuccessful or limited. According to embodiments of the present invention the present system and method can be used to measure film thickness in confined and inaccessible locations, and on substrates of complex geometry. The method can be used with an arbitrary and time varying orientation of the substrate-film interface. The measurements of the film thickness on the inside of open or enclosed channels of an arbitrary geometry, and on flexible substrates are possible. With multiple embedded sensors, the film thickness in different lateral locations can be simultaneously measured. The dielectric permittivity of the FUT as a function of the distance from the substrate of the film can also be measured.

32 Claims, 7 Drawing Sheets

MEASUREMENT OF THICKNESS OF DIELECTRIC FILMS ON SURFACES

CROSS-REFERENCE TO RELATED APPLICATIONS

This application claims the benefit of U.S. Provisional Patent Application No. 60/743,771, filed Mar. 24, 2006, and entitled "Measurement of Permittivity and Thickness of Dielectric Films on Surfaces of a Complex Geometry," and U.S. Provisional Patent Application No. 60/743,814, filed Mar. 27, 2006, and entitled "Measurement of Permittivity and Thickness of Dielectric Films on Surfaces of a Complex Geometry." Each of the above-referenced application is incorporated herein by reference in its entirety.

STATEMENT REGARDING FEDERALLY SPONSORED RESEARCH

This invention was made with government support under grant number CTS-9875462 by the National Science Foundation. The Government has certain rights to this invention.

BACKGROUND

1. Technology Field

The present invention generally relates to dielectric films. In particular, the present invention relates to structures and methods for measuring the thickness and dielectric permittivity of dielectric films deposited on a substrate.

2. The Related Technology

Accurate measurement of film thickness is an important problem in a wide range of applications. For example, such measurements are fundamental in microfabrication processes, such as chemical vapor deposition, molecular beam epitaxy, thermal oxidation, diffusion, and sputtering, and are essential in many biological and biomedical applications.

Various physical principles can be used to non-invasively estimate film thickness, including interferometry, sample weighing, x-ray photoelectron spectroscopy, wavelength scanning, ellipsometry, coherence tomography, and analytical electron microscopy. Unfortunately, most of these available techniques are limited to certain types of films, or may not be suitable for making in-situ measurements in real time.

A need therefore exists for a method by which film thickness deposited on a surface having a simple or complex geometry can be determined. Moreover, a need exists for such measurement to be performed at the location of the film and in real time, thereby enabling such measurement in locations previously unmeasurable or in environments with changing film thickness and properties. Also, it would be desirable to provide simultaneous dielectric permittivity and thickness measurements, thereby providing the ability to monitor in real time changing chemical or electrical characteristics of the film.

BRIEF SUMMARY

The present invention has been developed in response to the above and other needs in the art. Briefly summarized, embodiments of the present invention are directed to a system and method by which thickness of a dielectric film deposited on a substrate can be determined. The system and method are especially applicable to areas and applications where traditional techniques have proven unsuccessful or with only limited success.

According to embodiments of the present invention the present system and method can be used to measure film thickness in confined and inaccessible locations (such as inside an equipment or a tool, test cell, or in-vivo), and on substrates of complex geometry. The method can be used with an arbitrary and time varying orientation of the substrate-film interface (as in the case of a film on moving surfaces). The measurements of the film thickness on the inside of open or enclosed channels of an arbitrary geometry (wax deposits on the crude oil pipelines, stent restenosis, etc.), and on flexible substrates (membranes, diaphragms, etc.) are possible. With multiple embedded sensors, the film thickness in different lateral locations can be simultaneously measured. The dielectric permittivity of the film as a function of the distance from the substrate of the film can also be measured.

In another embodiment, the present invention allow for the real-time, in-situ measurements of the thickness of dielectric films and the dielectric permittivity of the film material. Film thickness and dielectric properties can be measured simultaneously, which is important when a film undergoes transformation due to aging, diffusion, chemical reaction, or any other reason which alters its dielectric properties. Embodiments of the present invention further allow for measurement of dielectric permittivity as a function of distance from the substrate on which the film is deposited.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Figure 1A:
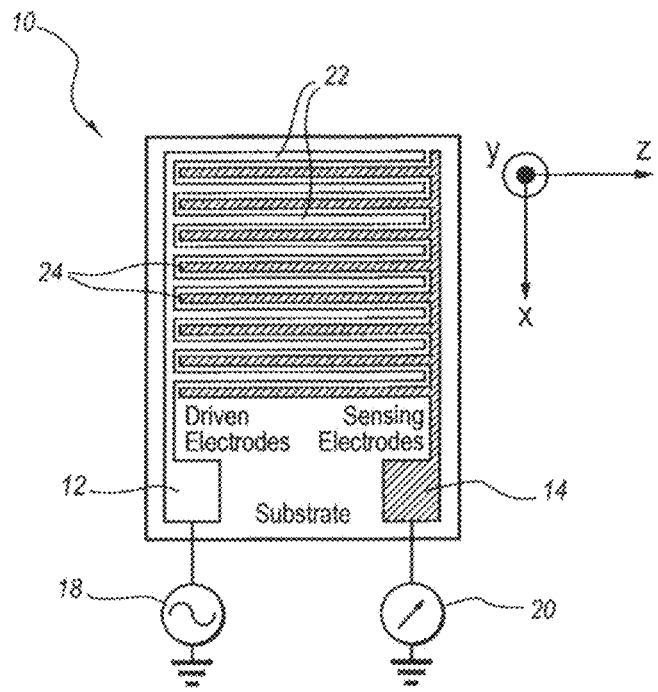
FIGS. 1A and 1B show top and cross sectional views of a fringe effect sensor employed in connection with one embodiment of the present invention.

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1A-9 depict various features of embodiments of the present invention, which is generally directed to a system and method by which thickness of a dielectric film deposited on a substrate can be determined. The system and method can determine the film thickness in-situ, or at the location of the film itself, thereby enabling film measurement at locations not previously possible. Moreover, embodiments of the present invention enable film thickness and dielectric properties of the film to be determined simultaneously, thereby allowing changes in film structure of electrical properties to be tracked in real time. Embodiments of the present invention further allow for measurement of dielectric permittivity as a function of distance from the substrate on which the film is deposited.

In brief, one embodiment of the present invention discloses a method for non-invasively measuring the thickness of a film deposited on an insulating substrate using a plurality of sensors embedded in the film substrate. These sensors, which in one embodiment are planar microelectrodes fabricated on the substrate, are employed to measure admittance levels present in the film proximate the sensors. The material under test ("MUT") is a film in contact with the sensor. The film is probed by applying an AC potential to selected electrodes, referred to herein as "driven electrodes." The resulting total current, I, is sensed through electrodes positioned in a predetermined manner with respect to the driven electrodes, which are referred to herein as "sensing electrodes." This current is measured and used to calculate sensor admittance. Film thickness and dielectric permittivity can then be calculated, as described more fully below.

A. Example Sensor Structure and Environment

FIG. 1 illustrates one possible arrangement of sensors, according to one embodiment. In particular, FIG. 1 shows top and cross sectional views of a "fringe effect" ("FE") sensor, generally designated at 10, and including a plurality of both driven electrodes 12 and sensing electrodes 14 disposed on a substrate 16. The driven electrodes 12 are operably coupled to an excitation potential source 18, while the sensing electrodes are operably coupled to a sensing apparatus, or meter 20, to measure the current resulting from the applied potential of the driven electrode. The measured current is used to calculate sensor admittance. By applying the potential difference between the driven and sensing electrodes of the FE sensor, a "fringing" electrical field is created in the film. The electrical properties of the sensing electrodes, such as admittance, are affected by the film, and are measured. As the sensor admittance is affected by the thickness of the film, it is a function of the thickness. These measurements can therefore be used to determine film thickness, as is described further below.

Figure 2:
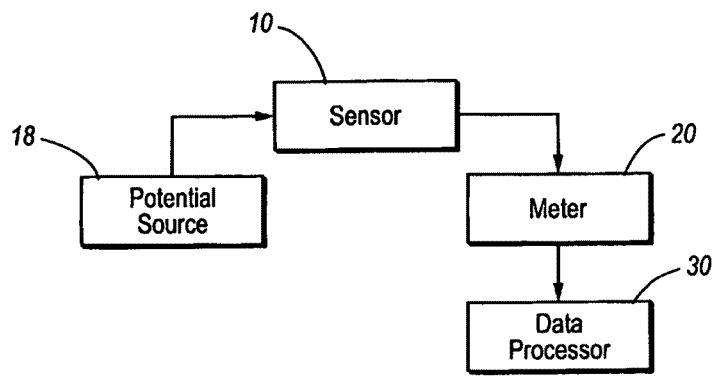
FIG. 2 is a simplified block diagram of a film measurement system employed in connection with one embodiment, including the fringe effect sensor of FIGS. 1A and 1B.

In greater detail, examples of sensor properties that depend on thickness and dielectric properties of the film include sensor admittance/impedance, and the equivalent capacitance and resistance of the FE sensor. These properties may be measured using a current meter, network analyzer, LCR meter, or other suitable measuring instrument. FIG. 2 shows one possible film measurement system including such a measuring instrument, according to one embodiment. In detail, FIG. 2 shows the FE sensor 10, operably coupled to the potential source 18. The meter or other suitable measuring instrument as described above is shown at 20. The meter 20 can be external, or packaged with the FE sensor 10 into a single integrated device. The instrumental measurements may be either communicated to a data processor 30 by wired or wireless transmission. In one embodiment, an integrated device can included the FE sensor, the meter, and the data processor, or any combination of these components. As mentioned above, film thickness and properties are estimated from the measurements taken by the system shown in FIG. 2.

In the embodiment illustrated in FIG. 1, the driven and sensing electrodes are intermeshed to form a particular type of FE sensor, referred to herein as an interdigitated-electrode ("IDE") sensor. The IDE design shown in FIG. 1 spaces the driven and sensing electrodes in a spatially periodic fashion, which simplifies the calculations to determine film thickness and dielectric permittivity. In particular, the driven electrode 12 includes a plurality of parallel fingers 22 extending on a top surface of the substrate 16, while the sensing electrode 14 includes a plurality of parallel extending fingers that are interposed with those of the driven electrode. The fingers 22 and 24 are composed of chromium, for instance, or other suitable material.

Note, however, that various other sensor positioning and spacing schemes can be alternatively employed. For instance, the sensor arrangement can be regular or irregular. The sensors can be produced and positioned for explicit use in determining film thickness, or can be defined by electrodes not positioned in a predetermined manner for practice of the present invention, such as electrodes of a microelectronic device that are included to provide the intended functionality of the device. Also, multiple sensors can be employed to form a sensor array. These and other variations in the sensor configuration are therefore contemplated as part of the present invention.

Figure 3:
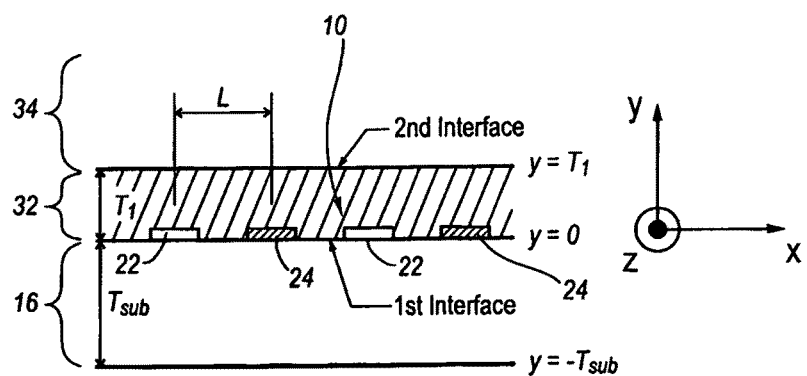
FIG. 3 is another cross sectional view of a fringe effect sensor employed in an exemplary implementation, according to one embodiment.

Reference is now made to FIG. 3, which shows one exemplary environment in which an embodiment of the present invention can be practiced. In particular, FIG. 3 depicts an IDE-type FE sensor including intermeshing driven and sensing electrode fingers 22 and 24 positioned on the substrate 16. The substrate 16 in one embodiment is composed of quartz. A film 32, also referred to herein as a film-under-test ("FUT"), is shown deposited atop the substrate on which FE sensor 10 is formed. As shown in FIG. 3, the substrate-FUT interface is indicated as the first interface. A semi-infinite dielectric layer ("SIL") 34 exists above the FUT 32 at a second interface, and in the present embodiment is composed of air. Note that the FUT 32 and SIL 34 have a differing dielectric permittivity, which enables embodiments of the present invention to best determine FUT thickness.

In greater detail, when the dielectric properties of FUT and SIL materials are dissimilar, the "fringing" distribution of the probing electric field through the sample, produced by driven electrodes of the IDE sensor, depends on the film thickness, $T_1$. Consequently, sensor admittance and other measurable electrical properties, such as sensor capacitance and resistance, depend on the film thickness $T_1$. By measuring such electrical characteristics of the sensor, film thickness and its permittivity can be determined using a method according to one embodiment of the present invention. As will be seen, the method involves estimating the unknown film thickness by matching the theoretical prediction of thickness-dependent sensor admittance with a measured admittance value.

Figure 1B:
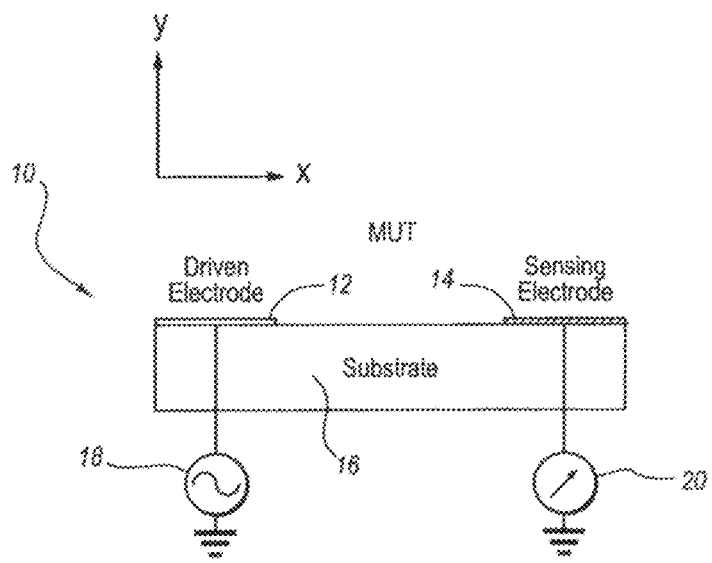

In the case of FE sensors with spatially periodic, interdigitated-electrode ("IDE") configuration as shown in FIGS. 1A, 1B, and 3, the admittance prediction is simplified, which allows for the real-time measurements of film thickness with a reduced number of computations. Such real-time measurement enables changes in the film thickness or permittivity to be immediately determined. Thus it is possible to continuously measure the changing dielectric permittivity of the FUT material, which further enables the determination of the thickness of films having changing dielectric properties, which may be caused by chemical or other transformations.

B. Methods for Determining Film Thickness

A method for non-invasively determining FUT thickness and dielectric permittivity in one embodiment using the periodic IDE-type FE sensor structure shown in FIGS. 1 and 3 proceeds as described below. Briefly, the method estimates thickness of the film by matching a thickness-dependent theoretical prediction of the sensor admittance with the actual sensor admittance as measured by Meter 20. First, a general summary of the method is given, followed by more detailed description of the method.

First, any stray contributions to sensor admittance, such as from contact impedance, interconnecting leads, variation in electrode geometry, etc., are estimated. This can be performed either before or after film deposition upon the substrate.

Second, the sensor admittance is predicted at one or more excitation frequencies as a function of film thickness, $T_1$ (FIG. 3). Note that this prediction is the most computationally intensive part of the method. After it has been predicted, the sensor admittance is adjusted for any stray contribution, estimated above. This yields the stray-adjusted predicted admittance. Note that the above steps can be carried out offline, or before the film thickness measurement is begun.

Third, the FUT having an unknown thickness is probed by measuring the admittance of the FE sensor, such as the IDE sensor shown in FIGS. 1A and 1B, at selected excitation frequencies. Note that only one excitation frequency may be used to measure the sensor admittance. However, to increase the robustness of the measurement, a plurality of excitation frequencies may be employed. The frequency-dependent excitation can be created in one embodiment by sweeping with a sinusoidally varying potential difference to the driven electrodes of the IDE sensor. Non-periodic voltage signal patterns, such as pulses, steps, chirps, etc., can also be used. Measurement of the admittance can be performed by current meter, network analyzer, LCR meter, or other measuring apparatus. These measurements can be forwarded to a data processor, via wired or wireless transmission, or may be processed locally in an integrated device that includes the sensors and a data processor.

Figure 6:
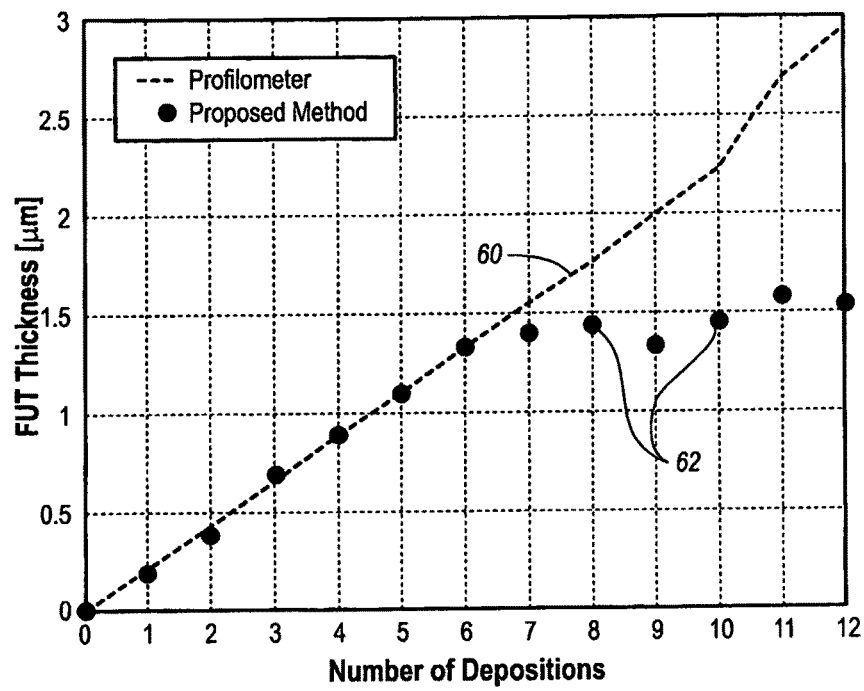
FIG. 6 is a graph depicting the agreement of the present method vs. direct measurement in determining the thickness of a deposited film.

Fourth, the stray-adjusted predicted admittance is compared with the measured sensor admittance for each excitation frequency and the thickness $T_1$ is determined that minimizes the difference between the stray-adjusted predicted admittance and the measured sensor admittance. A least squares estimate averaging of the film thickness at each excitation frequency can be performed to determine the final film thickness result, $T_1$. FIG. 6 shows agreement between practice of the present embodiment of the above method and actual measurements of film thickness for the FUT.

The third and fourth steps can be repeated to monitor variations in film thickness due to growth, degradation, or other reason.

In further detail, the central idea of the proposed method is to estimate $T_1$ by matching thickness-dependent theoretical prediction of the sensor admittance, $Y_{sen}$, with the measured admittance, $Y_m$. The formal statement of the problem is to find $T_1$, which solves the following optimization problem:

$$\min_{T_1} \|Y_m - Y_{sen}(T_1)\| \tag{1}$$

The solution can be found by, first, predicting $Y_{sen}$ as a function of $T_1$ (a direct problem) and then finding the thickness $T_h$ which minimizes the difference between the predicted and the measured sensor admittances (an inverse problem). Both, direct and inverse problems are computationally intensive in the general case of FE sensors of an arbitrary geometry and electrode configuration. However, as demonstrated in the Direct Problem section, the computational complexity is significantly reduced for IDE sensors because of the spatial periodicity of the excitation field.

The measured sensor admittance includes contributions from stray elements introduced by contact impedance, interconnecting leads, variation in electrode geometry, and other factors. The theoretical prediction of stray contributions, $Z_{Stray}$, is difficult, if not impossible. Therefore, a practically useful implementation of the central idea of finding $T_1$ must be modified to account for $Z_{stray}$.

The procedure for estimating unknown stay contribution using the admittance measurements of the FE sensor with a known sample is given in the Stray Contributions section. With known $Z_{stray}$, the optimization problem (1) is modified and $T_1$ is found by minimizing the difference between $Y_m$ and the stray-adjusted prediction, $Y_{sen}(T_1)$, given by the following equation:

$$Y'_{sen}(T_1) = \left[\frac{1}{Y_{sen}(T_1)} + Z_{stray}\right]^{-1} \tag{2}$$

An equivalent way to account for the effect of $Z_{stray}$ is to minimize the difference between stray-adjusted measurements, $Y_m$, and theoretical predictions $Y_{sen}$.

For low-loss dielectrics, the measured admittance is often expressed as $$Y_m(\omega) = \frac{1}{R_m(\omega)} + j\omega C_m(\omega) \tag{3}$$

where $\omega$ is the angular excitation frequency and $C_m$ and $R_m$ are the measured capacitance and resistance of the FE sensor, respectively. Both $R_m$ and $C_m$ depend on film thickness. Because it is difficult to accurately measure very high resistances, a particular implementation of the method, outlined in "Estimation of the Film Thickness" section (below), is to estimate $T_1$ by minimizing the error between the measured capacitance $C_m$ and its stay-adjusted theoretical prediction $C_{sen}(T_1)$. For materials with higher conductive losses, the thickness can be estimated by obtaining the best possible match between $R'_{sen}(T_1)$ and the measured $R_m$.

1. Direct Problem

Consider a dielectric film of thickness $T_1$ and permittivity $\varepsilon^*_{fut}$, deposited on the sensor substrate of thickness $T_{sub}$ and permittivity $\varepsilon^*_{sub}$. Assume that the bottom of the sensor substrate is grounded, $\phi(x, y=-T_{sub}, z)=0$, and that the dielectric permittivity of the semi-infinite layer, $\varepsilon^*_{sib}$ is known.

FIG. 1 illustrates the described configuration for the specific case of a semi-infinite layer of dry air and silicon nitride FUT deposited on the quartz substrate of the IDE sensor.

For an arbitrary FE sensor, the theoretical prediction of sensor admittance is given by the following integral, calculated over the surface S of sensing electrodes:

$$Y_{sen} = \frac{I}{\hat{\phi}_d} = \frac{j\omega\epsilon_0}{|\varphi_d|} \oint_S \epsilon^* E d\bar{s} \quad (4)$$

where $\hat{\phi}_d = |\phi_d|\exp(j\phi t)$ is the sinusoidal potential of frequency $\omega$, applied to the driven electrodes with sensing electrodes kept grounded; $I=I_{sub}+I_{sam}$ is the total electric current through the sensor substrate and the sample (in FIG. 1, FUT plus the semi-infinite layer); the complex dielectric permittivity $\in^*$ is equal to either $\in^*_{sub}$, $\in^*_{fut}$, or $\in^*_{sil}$ depending on the coordinate y; $\in_0$ is the dielectric constant of free space; and E is the complex vector of electric field created by the FE sensor. The electric field can be calculated if the potential distribution, $\phi$, is known inside the substrate, FUT, and the semi-infinite layer. In electroquasistatic approximation of Maxwell equations, potential distribution satisfies the Laplace equation, $\nabla^2\phi=0$, and is continuous across all interfaces.

Assume that the potential distribution is two-dimensional, $\phi(x, y, z) = \phi(x, y)$, which implies a two-dimensional electrical field, $E=(E_x, E_y)$. For IDE sensors of a high ratio of the electrode length in z direction, $L_{sen}$, to their width in x direction, such an assumption leads to a minimal error. Furthermore, we will ignore the thickness of electrodes, which is typically much smaller than other dimensions of the sensor. Under these assumptions, for periodically structured FE sensors, we can derive an explicit expression for $Y_{sen}$. We begin by expressing the potential distribution as an infinite series:

$$\varphi(x, y) = \sum_{n=0}^{\infty} \varphi_n(x, y) \quad (5)$$

where each component $\phi_n$ must satisfy the Laplace equation: $\nabla^2 \phi_n = 0$, $n=0, 1, 2, \ldots$.

The solution for $\phi_n$ in the limiting case of a single interface at $y=0$ (obtained when $T_1=0$ or $T_1=\infty$) was previously obtained, for example, in a method obtained in the article: Choi, Y. H.; Skliar, M., "Standard-Independent Estimation of Dielectric Permittivity with Microdielectric Fringe-Effect Sensors," *Analytical* 2005, 77, 871 (hereinafter "Choi"), where the potential distribution was then used to develop a standard-independent method for quantitative dielectroscopic measurements of the permittivity of the semi-infinite layer of the MUT. Using a similar approach for the system with two interfaces at $y=0$ and $y=T_1$, depicted in FIG. 3, but omitting mathematical details, the following solution is found:

$$\varphi_n(x, y) = \quad (6)$$

$$\begin{cases} [\coth(k_n T_{sub})\sinh(k_n y) + \cosh(k_n y)]\varphi_n^{(1)}(x), & -T_{sub} \le t \le 0 \\ \frac{\sinh(k_n y)}{\sinh(k_n T_1)}\varphi_n^{(2)}(x) - \frac{\sinh[k_n(y-T_1)]}{\sinh(k_n T_1)}\varphi_n^{(1)}(x), & 0 \le y \le T_1 \\ -\{\sinh[k_n(y-T_1)] - \cosh[k_n(y-T_1)]\}\varphi_n^{(2)}(x), & T_1 \le y \le \infty \end{cases}$$

where $k_n = n\pi/L$, L is the distance between the centers of the two adjacent electrodes and the infinite summations of $\phi_n^{(1)}$ and $\phi_n^{(2)}$ are equal to the potentials at the two interfaces:

$$\varphi(x, y=0) = \sum_{n=0}^{\infty} \varphi_n^{(1)}(x) \text{ and } \varphi(x, y=T_1) = \sum_{n=0}^{\infty} \varphi_n^{(2)}(x)$$

We now consider a series solution for the normal component of the electric field:

$$E_y = \sum_{n=0}^{\infty} E_{y,n}$$

Since $E = -\nabla\phi$, we obtain from eq 6 that $$E_{y,n}(x, y) = \begin{cases} -k_n\left[\coth(k_n T_{sub})\cosh(k_n y) + \sinh(k_n y)\right]\varphi_n^{(1)}(x), & -T_{sub} \le y \le 0 \\ -k_n\frac{\cosh(k_n y)}{\sinh(k_n T_1)}\varphi_n^{(2)}(x) + k_n\frac{\cosh[k_n(y-T_1)]}{\sinh(k_n T_1)}\varphi_n^{(1)}(x), & 0 \le y \le T_1 \\ k_n\left\{\cosh[k_n(y-T_1)] - \sinh[k_n(y-T_1)]\right\}\varphi_n^{(2)}(x), & T_1 \le y \le \infty \end{cases} \quad (7)$$

Therefore, at the first interface $y=0$:

$$E_{y,n}^{(1)a}(x) = E_{y,n}(x, 0^+) = -\frac{k_n}{\sinh(k_n T_1)}\varphi_n^{(2)} + k_n\coth(k_n T_1)\varphi_N^{(1)} \quad (8)$$

$$E_{y,n}^{(1)b}(x) = E_{y,n}(x, 0^-) = -k_n\coth(k_n T_{sub})\varphi_n^{(1)} \quad (9)$$

where superscript a and b denote the location immediately above ($y=0^+$) and below ($y=0^-$) the interface, respectively. Similarly, at the second interface $y=T_1$:

$$E_{y,n}^{(2)a}(x) = E_{y,n}(x, T_1^+) = k_n\varphi_n^{(2)} \quad (10)$$

$$E_{y,n}^{(2)b} = E_{y,n}(x, T_1^-) = -k_n\coth(k_n T_1)\varphi_n^{(2)} + \frac{k_n}{\sinh(k_n T_1)}\varphi_n^{(1)} \quad (11)$$

Each component of the series solution at both interfaces must also satisfy the following continuity conditions:[14]

$$\in^*_{fut} E_{y,x}^{(1)a} = \in^*_{sub} E_{y,x}^{(1)b} \quad (12)$$

$$\in^*_{sil} E_{y,x}^{(2)a} = \in^*_{fut} E_{y,x}^{(2)b} \quad (13)$$

which allows us to establish the relationship between the components of the series representations of potentials $\phi_n^{(1)}$ and $\phi_n^{(2)}$ at the two interfaces:

$$\varphi_n^{(2)} = \frac{\epsilon^*_{fut}}{\sinh(k_n T_1)[\epsilon^*_{sii} + \epsilon^*_{fut}\coth(k_n T_1)]}\varphi_n^{(1)} \quad (14)$$

Using eq 14 in eq 8, one obtains that $$E_{y,x}^{(1)a}(x) = s_x(k_x\phi_x^{(1)}(x)) \quad (15)$$

where, for a finite, nonzero $T_1$, $$s_n = \coth(k_n T_1) - \frac{1}{\sinh^2(k_n T_1)} \left[ \frac{\epsilon^*_{fut}}{\epsilon^*_{sil} + \epsilon^*_{fut}\coth(k_n T_1)} \right] \quad (16)$$

For large $T_1$, $s_n \to 1$. On the other hand, as $T_1 \to 0$, $\in^*_{fut}$ becomes equal to the permittivity of a semi-infinite layer, and $s_n$ again tends to 1. Therefore, as expected, when $T_1 = \infty$ or 0, the solution with two interfaces is reduced to the case of a single sensor-sample interface, previously considered in Choi.

The periodicity and even symmetry of the IDE sensor geometry implies that the potential at the first interface can be expressed as the following Fourier cosine series:

$$\varphi(x, y=0) = \sum_{n=0}^{\infty} \varphi_n^{(1)} = \sum_{n=0}^{\infty} f_n \cos(k_n x) \quad (17)$$

where $f_n$ are the Fourier coefficients. The truncated expression for the normal components of the electric field at the first interface, needed to obtain theoretical prediction of the sensor admittance, is given by the following Fourier series solution:

$$E_y^{(1)a} = \sum_{n=0}^{m} E_{y,n}^{(1)a} = \sum_{n=0}^{m} s_n[k_n f_n \cos(k_n x)] \quad (18)$$

$$E_y^{(1)b} = \sum_{n=0}^{m} E_{y,n}^{(1)b} = -\sum_{n=0}^{\infty} k_n \coth(k_n T_{sub}) f_n \cos(k_n x) \quad (19)$$

which depend on yet undetermined Fourier coefficients, $f_n$.

a. Potential Profile at the FUT-Substrate Interface

The expression for the electrical potential at a single interface between the sensor substrate and semi-infinite sample ($T_1 = \infty$ or 0) was obtained in Choi. Following the same approach, it can be shown that, in the case of two interfaces at $y=0$ and $y=T_1$, the potential at the film-substrate interface satisfies the following expression:

$$[\in^*_{sub}B + \in^*_{fut}A]F = |\phi_d|[\in^*_{sub}BM + \in^*_{fut}AM]\Phi = 0_1 \quad (20)$$

where $F=[f_0, f_1, \ldots, f_m]^T$ is the vector of complex Fourier coefficients; $\Phi=[1, \phi_0(x_1), \phi_0(x_2), \ldots, \phi_0(x_i), \ldots, \phi_0(x_k),]^T$ is the vector of scaled complex values of the potential distribution ($\phi_0(x_i)=0)/|\phi_d|$), evaluated in k uniformly spaced points at the substrate-FUT interface with coordinates $x_i=(L/[2(k+1)])i+L/4, i=1, \ldots, k$; the real matrices $M \in R^{(m+1)\times(k+1)}$ and $\in R^{k\times(m+1)}$ are given in Choi by eqs 10 and 15, respectively; $0_1$ is the k-dimensional zero vector; the complex matrix $A \in C^{k\times(m+1)}$ is defined by its components:

$$A_{i,n+1} = s_n \left[ \sin\left(k_n \frac{x_{i+1}+x_i}{2}\right) - \sin\left(k_n \frac{x_i+x_{i-1}}{2}\right) \right] \quad (21)$$

which depend on FUT thickness $T_1$.

To solve for unknown components of $\Phi$ and Fourier coefficients, F, define the matrix $T=[\in^*_{sub}BM + \in^*_{fut}AM]$ and partition it as $T=[T_1\ T_2]$, where the column vector $T_1=T(:,1)$ and the matrix $T_2=T(:,2:k+1)$. In this new notation, eq 20 can be written as $$T_2 \Phi_p = -T_1 \quad (22)$$

where we took into account that $\Phi(1)=1$ and gathered unknown values of the scaled potential in collocation points $x_i$ at $y=0$ into the vector $\Phi_p = \Phi(2:k+1)$. If $T_1$, $T_{sub}$, and the dielectric permittivities $\in^*_{fut}$, $\in^*_{sib}$, $\in^*_{sub}$, are known, then $T_1$ and $T_2$ can be calculated, and eq 22 can be solved for unknown interfacial potentials $\Phi_p$. With known $\Phi_p$, the Fourier coefficients are calculated as $F=|\phi_d|M\Phi$. The potential distribution at the second ($y=T_1$) interface, which may be of separate interest, can be found from eq 14.

b. Prediction of the Sensor Admittance, $Y_{sen}$

For spatially periodic IDE sensors, if we ignore the thickness of sensor electrodes, eq 4 is simplified to the following expression:

$$Y_{sen} = \frac{j\omega\epsilon_0 N_e L_{sen}}{|\varphi_d|} \int_{\frac{3L}{4}}^{L} [\epsilon^*_{sub} E_{y(1)}^b - \epsilon^*_{fut} E_{y(1)}^a] dx \quad (23)$$

where $N_e$ is the total number of IDE electrodes and $L_{sen}$ is the electrode length in z direction. Using the derived expressions for $E^a_{y(1)}$ and $E^b_{y(1)}$, after the integration, we obtain $$Y_{sen} = \frac{j\omega\epsilon_0 N_e L_{sen}}{|\varphi_d|} [\epsilon^*_{sub} D + \epsilon^*_{fut} C] F \quad (24)$$

$$= j\omega\epsilon_0 N_e L_{sen}[\epsilon^*_{sub} DM + \epsilon^*_{fut} CM]\Phi$$

where the elements of the complex matrix $C \in C^{1\times(m+1)}$ and the real matrix $D \in R^{1\times(m+1)}$ are equal to $$C_{1,n+1} = s_n \sin\left(k_n \frac{3L}{4}\right) \quad (25)$$

$$D_{1,n+1} = \coth(k_n T_{sub}) \sin\left(k_n \frac{3L}{4}\right) \quad (26)$$

With known $\in^*_{fut}$, $\in^*_{sil}$, $\in^*_{sub}$, eq 24 gives the prediction of the IDE sensor admittance as a function of the FUT thickness, $T_1$.

c. 1.3. Stray Contributions

The impedance contribution of stray elements can be estimated by comparing the theoretical prediction of the sensor impedance, $1/Y_{sen}(T_1)$, calculated using eq 24 for the FUT of known thickness and $\in^*_{fut}$, with the corresponding measured sensor impedance:

$$Z_{stray} = \left[ \frac{1}{Y_m} - \frac{1}{Y_{sen}(T_1)} \right] \quad (27)$$

The estimated $Z_{stray}$ is later used to adjust for stray contributions the predictions and the measurements of the sensor admittance with the FUT of an unknown thickness.

2. Estimation of the Film Thickness

Assume that dielectric permittivities $\in^*_{fut}$, $\in^*_{sil}$, $\in^*_{sub}$, are isotropic and known. The following steps summarize the proposed method for noninvasive measurement of dielectric film thickness using FE sensors of a given periodic design:

First, estimate stray contributions as described in the Stray Contributions section. Equation 27 allows us to estimate $Z_{stray}$ based on $Y_m(\omega)$ measurements and the corresponding $Y_{sen}(T_1;\omega)$ predictions for the FUT of any known thickness. It may be convenient to estimate strays when $T_1=0$, before the film is formed.

Second, use eq 24 to predict sensor admittance, $Y_{sen}$, at frequencies ω; as a function of $T_1$. This prediction is the most computationally intensive part of the method. Then, use eq 2 to adjust $Y_{sen}$ for the stray contribution, $Z_{stray}$, to obtain $Y_{sen}$. Note that the first and second steps may be carried out off line, before the measurements of an unknown film thickness are started.

Third, probe the FUT of unknown thickness by measuring $Y_m$ of the FE sensor at selected excitation frequencies, $\omega_i$, i=1, . . . , $N_f$.

Fourth, compare the stray-adjusted prediction, $Y_{sen}(\omega_i)$, with the measured $Y_m(\omega_i)$. At each frequency, determine $T_1$, which minimizes the difference between $Y_{sen}$ and $Y_m$. The least-squares estimate of the film thickness, $T_1$, is the average of the results at different excitation frequencies:

$$\bar{T}_1 = \frac{1}{N_f} \sum_{i=1}^{N_f} T_1(\omega_i) \tag{28}$$

Fifth, the measurements of the time-varying film thickness (due to growth, degradation, cyclic change, or any other reason) are obtained by repeated execution of the third and fourth steps.

The theoretical prediction of the sensor admittance (direct problem, second step) in the general case of FE sensors of arbitrary design, configuration, and electrode geometry (including the case of nonplanar, curvilinear, and flexible substrates) must be based on the general eq 4 and will require numerical calculation of nonuniform, three-dimensional excitation field, $E=(E_x, E_y, E_x)$.

The experimental validation with low-loss dielectric film, described below, uses a particular embodiment of the developed method, which estimates the film thickness (step 4) by minimizing the error between the measured capacitance, $C_m(\omega_i)$ and its stray-adjusted prediction given by $$C'_{sen}(T_1) = \frac{1}{\omega} \text{Im}[Y'_{sen}(T_1)] \tag{29}$$

Equations 24, 2, and 29 are used off-line to create a lookup table for $C_{sen}$ as a function of frequencies and $T_1$. The time-varying film thickness is then estimated by interpolating between table entries to match the measured capacitance, $C_m(\omega_i)$.

3. Experimental Validation

The developed method was tested using an IDE sensor (MS-01, Netzsch Instruments, Burlington, Mass.), consisting of 1500 ($N_e$=2×750) chromium electrodes microfabricated on a quartz substrate. The electrode spacing, length ($L_{sen}$), width, and L are 1, 800, 1, and 2 µm, respectively. At the beginning of the experiments, the sensor was cleaned in piranha solution, rinsed with deionized water, and dried. The admittance, capacitance, and resistance spectra were measured using a precision LCR meter (HP 4284A, Agilent Technologies, Palo Alto, Calif.) in the range of excitation frequencies from $10^3$ to $10^5$ Hz.

The dielectric permittivity of the sensor substrate was obtained experimentally. One MS-01 sensor was sacrificed to form a parallel plate (PP) capacitor by vacuum sputter deposition of chromium on both sides of the sensor substrate. The permittivity $\in^*_{sub}$ was calculated from the measurements of the dissipation factor and capacitance of the formed PP capacitor, which were acquired using the parallel plate test fixture (HP 16451B, Agilent Technologies).

A silicon nitride film of unknown thickness $T_1$ was deposited on the surface of the IDE sensor in 12 increments by rf magnetron sputtering (Discovery 18 DC/RF Research Magnetron Sputter Deposition System, Denton Vacuum, Moorestown, N.J.) of 99.9% pure silicon nitride target (Kurt J. Lesker Co., Clairton, Pa.). A microscope slide, partially covered by an acrylic adhesive tape, was placed inside the sputtering chamber in the immediate proximity of the sensor. By the experimental design, the thickness of the silicon nitride layer on the microscope slide and the IDE sensor were the same.

After each incremental deposition of silicon nitride, the following were measured:

First, new thickness of the silicon nitride layer on the microscope slide. The thickness was measured using contact profilometer (Dektak III surface profiler, Veeco, Woodbury, N.Y.) as the average difference in surface levels of areas covered by the tape and exposed to sputtering.

Second, the capacitance $C_m(\omega_i)$ and resistance $R_m(\omega_i)$ of the IDE sensor. The corresponding sensor admittance is given by eq 3. The measured $C_m$ as a function of the number of deposited layers and the excitation frequency f=ω/2π is plotted in FIG. 5.

a. Results

Figure 4A:
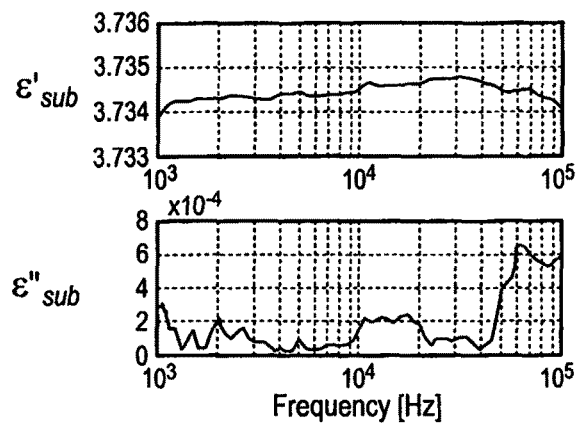
FIGS. 4A-4C are graphs depicting various properties relating to a method for determining film thickness, according to one embodiment.

The measured permittivity of the sensor substrate, $\in^*_{sub}$, is shown in FIG. 4A as the dielectric storage, $\in'_{sub}$, and loss, $\in''_{sub}$, spectra.

Figure 4B:
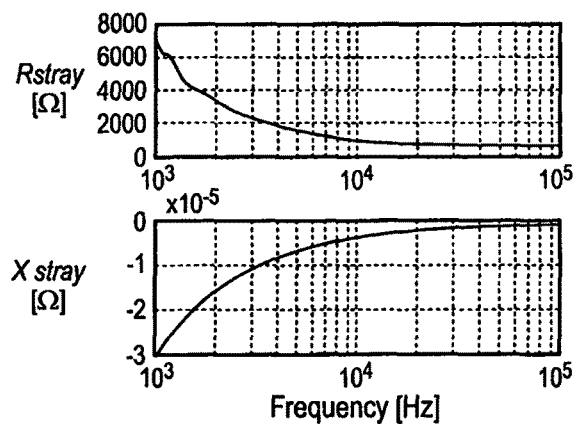

The stray contribution, $Z_{stray}$, was estimated from eq 27 by comparing the measured admittance, $Y_m$, of the sensor before FUT was deposited ($T_1=0$) with the corresponding to theoretical prediction, $Y_{sen}(T_1=0)$, given by eq 24. The prediction was calculated using the measured substrate permittivity, $\in^*_{sub}$, and assuming that $\in^*_{sil}=1$, which is a good approximation for the dry air. The result in the form of the real and imaginary parts of $Z_{stray}$ is shown in FIG. 4B.

Figure 4C:
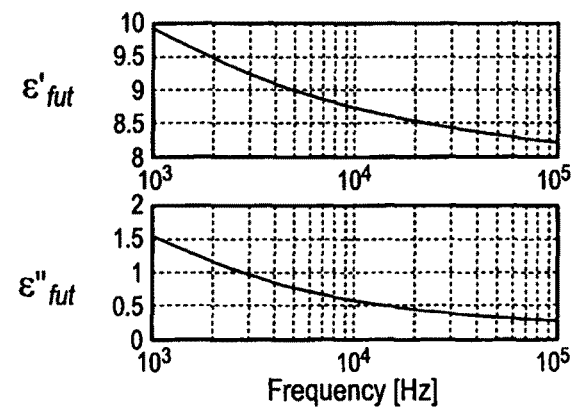
Figure 5:
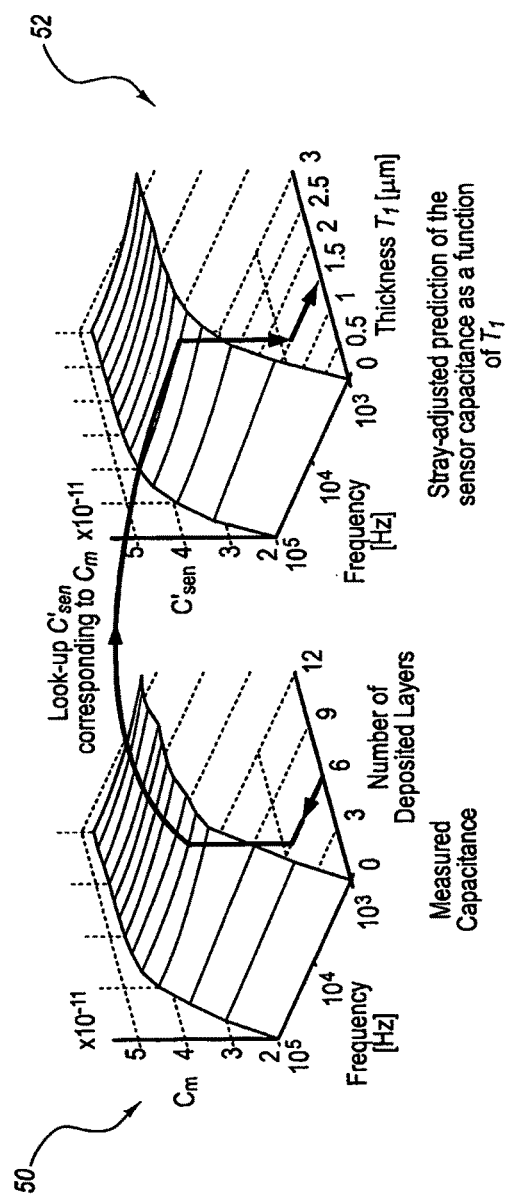
FIG. 5 illustrates two graphs depicting details relating to the method for determining film thickness, according to one embodiment.

The dielectric permittivity of the FUT material, $\in^*_{fut}$, must be known to predict the sensor admittance. We did not assume that $\in^*_{fut}$ is equal to the permittivity of the sputtering target, because the properties of the dielectric films, deposited by sputtering, are known to depend on processing conditions. Instead, we continued the incremental deposition of silicon nitride until $Y_m$ (and $C_m$) saturated with the number of depositions and became insensitive to further increase in $T_1$. The measurements of $C_m$ as a function of incremental depositions, seen in FIG. 5, agrees with the theoretical expectation that the sensor admittance for $T_1/L$>>1 is essentially equal to the sensor admittance when $T_1 \to \infty$. We, therefore, assumed that after the final 12th incremental deposition, which increased the FUT thickness to ~3 L/2, the contribution of the semi-infinite layer of dry air to the measured $Y_m$ can be ignored, and we effectively have a case of the semi-infinite silicon nitride layer on the sensor substrate. The dielectric permittivity of FUT, $\in^*_{fut}$, was then obtained using the method described in Choi. The results are shown in FIG. 4C.

With known permittivities ($\in^*_{fut}, \in^*_{sil}, \in^*_{sub}$), the sensor admittance, $Y_{sen}$, was predicted as a function of the FUT thickness, as described in the "Prediction the Sensor Admittance" section, above. The predictions were obtained by retaining the first 50 components in the series solution for the electric field (m=50), and the result was adjusted for the stray contribution. The stray-adjusted prediction of the sensor capacitance was obtained according to eq 29.

After each incremental deposition, the new value of $T_1(\omega_i)$ was found by matching the stray-adjusted predictions of the sensor capacitance, $C_{sen}(T_1)$, to the direct capacitance measurements, $C_m$. The process, illustrated by FIG. 5, was repeated for all $\omega_i$.

The frequency-averaged result, $T_1$, is plotted in FIG. 6, where the error bars indicate the standard deviation of $T_1$, estimated at different frequencies. The comparison with the direct, profilometer measurements shows substantial agreement of the developed methods with the independent thickness measurements when the film thickness is less than ~(⅔) L. The admittance measurements become increasingly insensitive to changing film thickness when $T_1$ becomes large relative to the electrode spacing, L.

The developed method estimates the unknown thickness of a dielectric film by minimizing the difference between the measured and predicted passive electrical properties of the FE sensor located at the film interface. In one implementation, after accounting for the contribution of stray elements, the film thickness is obtained by matching thickness-dependent predictions and measurements of FE sensor admittance. In the general case of an arbitrary configuration of interfacial electrodes, used to create the fringing electrical field inside the FUT, the numerical solution of the direct and inverse problems may be computationally expensive to obtain. However, for FE sensors of periodic, interdigitated electrode configuration, the implementation is significantly simplified and is suitable for the real-time measurements of rapidly evolving film thickness.

The maximum measurable film thickness is determined by the spacing of the sensor electrodes. In the case of IDE sensors, the maximum measurable $T_1$ is controlled by the characteristic distance, L, between centers of adjacent electrodes. Consequently, the upper range of thickness measurements can be easily tailored to the specific needs by selecting a sensor with an appropriate L.

The strong influence of the electrode spacing on the range of sensor sensitivity is explained by eq 7, which indicates that the strength of the probing electric field in the direction normal to sensor-film interface decays exponentially (approximately as $\exp(-T_1/L)$). The experimental results of FIG. 6 show that it was possible to accurately measure the FUT thickness for $T_1 \leq (\frac{2}{3})$ L.

The minimum measurable film thickness is limited by the measurement noises and the accuracy of the admittance measurements. If instrumental accuracy and the measurement noise are not the constraining factors, then the effect of the nonzero height of the sensor electrodes (typically in the nanometer range for microfabricated FE sensors) must be taken into the account. This can be done by accounting for the contribution of the parallel plate capacitor, formed by the FUT material between the electrodes of a finite height, to the prediction of the sensor admittance.

The dynamic range (defined as the ratio of maximum to minimum measurable film thickness) may be improved by using an array of FE sensors with different L. The improved dynamic range may also be achieved using a single sensor with addressable electrodes, thus allowing us to select electrode spacing equal to $I_{nt}L$, where $I_{nt}$ is an integer. Note, however, that, by increasing $i_{nt}$, the overall sensor admittance will decrease because of the following factors: (1) The admittance of any two further separated driven-sensing electrodes is smaller; (2) The number of active FE electrode pairs, contributing to the overall sensor admittance, will decrease. Therefore, an increased $I_{nt}$ will lead to a decreased signal-to-noise ratio.

In another embodiment, the present method can be employed to simultaneously measure the film thickness and the dielectric permittivity of the FUT. This is especially important when a film material undergoes transformation due to aging, diffusion, chemical reaction, or any other reason that alters its dielectric properties. As an example, simultaneous thickness and permittivity measurements is important in detecting incipient damage to protective paints and coatings caused by degradation of material properties of the protective layer (due to aging, moisture and solvent diffusion, chemical reactions, and other causes) without changes in its thickness. As an illustration of this capability, consider an array of FE sensors, shown in FIG. 8, and assume that one of the sensors in the array (sensor 10A) has electrode spacing, L, that is small relative to the measurement range of $T_1$. The admittance of this sensor will be almost exactly the same as if the FUT had an infinite thickness, and the method in Choi can be used to measure $\in^*_{fut}$ as a function of time. With this information, the remaining sensors in the array can be used to measure the time-varying film thickness. When $\in^*_{fut}$ changes with y, multiple sensors in the array can be used to estimate the permittivity as a function of the distance from substrate-FUT interface. In this case sensor 10A will provide the measurements of $\in^*_{fut}$ in the immediate vicinity of the interface. The measurements of sensor 10B can then be used to estimate $\in^*_{fut}$ further away from the interface, and so on until the permittivity of the film is profiled over the entire film thickness. Note that the resolution with which spatially varying $\in^*_{fut}$ can be resolved depends on the number of sensors in the array and the increments in the electrode spacing of the array's sensors.

The experimental testing of the developed method has revealed that the incrementally increasing thickness of the silicon nitride film is accurately measured in the expected range of the IDE sensor sensitivity, $T_1 \leq (\frac{2}{3})$ L=⅔ μm. The ability to simultaneously measure $T_1$ and $\in^*_{fut}$ was demonstrated by first, measuring the film permittivity when thickness exceeded the measurable range of the sensor and then using this information to reconstruct the history of evolving film thickness based on the admittance measurements, taken after each consecutive deposition, starting with $T_1$=0.

The experimental demonstration of the developed method was for the case of a low-loss dielectric film. Because of high FUT resistance, the measurement of thickness was based on matching thickness-dependent prediction of sensor capacitance with the measured value. When FUT material is lossy, the thickness measurement may be based on matching the predication of the FE sensor resistance with the corresponding resistance measurements. For certain materials, it may be advantageous to estimate $T_1$ based on both imaginary and real parts of the sensor's admittance. Note that the developed method is applicable when the FUT and the media in which it develops have dissimilar dielectric storage, loss spectra, or both.

In view of the above discussion, it is appreciated that embodiments of the present invention allow for the real-time, in-situ measurement of the thickness of dielectric films and the dielectric permittivity of the film material. Film thickness and dielectric properties can be measured simultaneously, which is important when a film undergoes transformation due to aging, diffusion, chemical reaction, or any other reason which alters its dielectric properties. Embodiments of the invention can be used to measure film thickness in confined and inaccessible locations (such as inside an equipment or a tool, test cell, or in-vivo), and on substrates of complex geometry. The method can be used with an arbitrary and time varying orientation of the substrate-film interface, as in the case of a film on moving surfaces.

Figure 7:
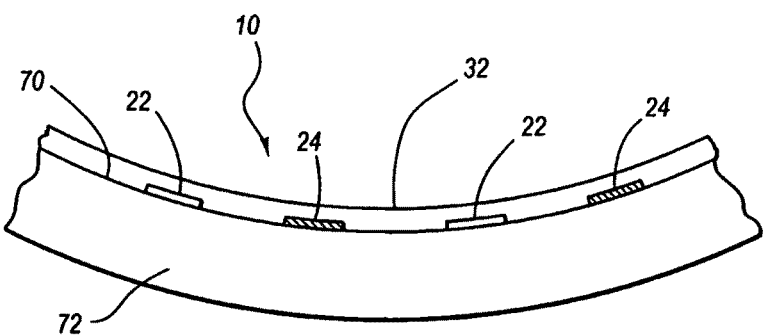
FIG. 7 is a cross sectional view depicting one possible environment in which a fringe effect sensor can be used to determine film thickness, according to one possible embodiment.
Figure 8:
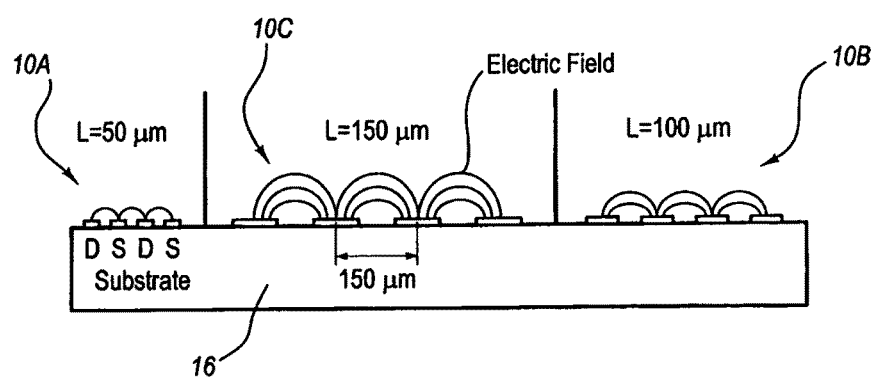
FIG. 8 is a simplified side view illustrating various aspects regarding the operation of fringe effect sensors, according to one embodiment.

The measurements of the film thickness can be made for films on non-planar substrates (e.g., biofilm growth on implanted devices, degradation of protective coatings on sharp edges, transitions, and other complex geometries of protective coatings), including inside open or enclosed channels of arbitrary geometry (e.g., wax deposits on the crude oil pipelines, stent restenosis). One example of a non-planar geometry is shown in FIG. 7, wherein an FE sensor 10 is positioned on an inner surface 70 of a pipe 72, for instance, on which the film 32 has grown. Use of the method for film measurement on flexible substrates such as membranes or diaphragms, and in confined or inaccessible areas is also possible.

Other possible applications include the measurement of degradation of protective layers, such as protective layers of aircraft paint, and control of deposition and etching in microfabrication processes. With multiple embedded sensors, the film thickness in different lateral locations can be simultaneously measured. And, the dielectric permittivity of the FUT as a function of the distance from the film's substrate can also be measured.

Figure 9:
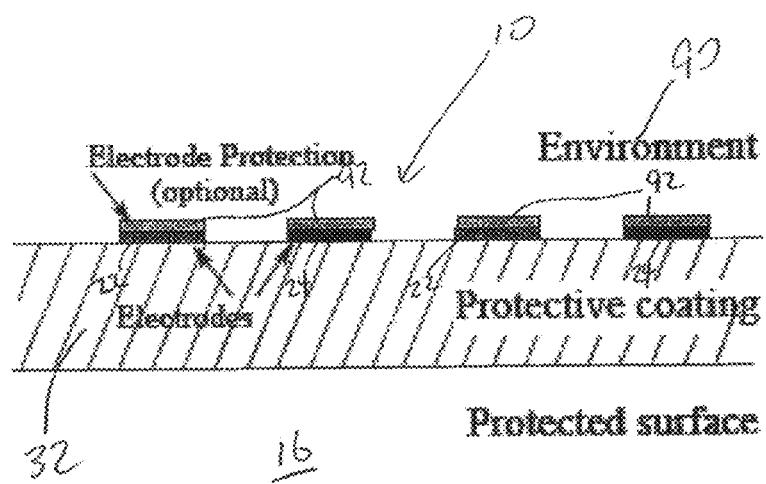
FIG. 9 is a cross sectional view of a fringe effect sensor employed in an exemplary implementation, according to one embodiment.

Reference is now made to FIG. 9. In one embodiment, the FE sensor 10 can be positioned at an interface of the film 32 with an environment 90 in which the film is disposed, such as air, for instance. This enables the FE sensor 10 to determine the thickness of the film 32 atop the substrate 16 as before, but from a different point of reference, i.e., the interface between the film and the environment 90. In the illustrated embodiment, the film 32 is a protective coating applied to a protected surface substrate. However, it is appreciated that many different possible film/surfaces can benefit from this embodiment, including for example body surface of a patient, painted walls or other surfaces, etc. Indeed, in one embodiment, the FE sensor can be included as part of a portable or hand-held device for placement on a film to be tested.

Embodiments of the present invention may include a special purpose or general-purpose computer including computer hardware, as discussed in greater detail below. Embodiments within the scope of the present invention may also include computer-readable media for carrying or having computer-executable instructions or data structures stored thereon. Such computer-readable media can be any available media that can be accessed by a general purpose or special purpose computer. By way of example, and not limitation, computer-readable media can comprise physical (or recordable-type) computer-readable storage media, such as, RAM, ROM, EEPROM, CD-ROM or other optical disk storage, magnetic disk storage or other magnetic storage devices, or any other medium which can be used to store desired program code means in the form of computer-executable instructions or data structures and which can be accessed by a general purpose or special purpose computer.

In this description and in the following claims, a "network" is defined as one or more data links that enable the transport of electronic data between computer systems and/or modules. When information is transferred or provided over a network or another communications connection (either hardwired, wireless, or a combination of hardwired or wireless) to a computer, the computer properly views the connection as a computer-readable medium. Thus, by way of example, and not limitation, computer-readable media can also comprise a network or data links which can be used to carry or store desired program code means in the form of computer-executable instructions or data structures and which can be accessed by a general purpose or special purpose computer.

Computer-executable instructions comprise, for example, instructions and data which cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may at least in part be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

An example computer architecture that facilitates identifying appropriate client-side script references can include one or more computer systems and a network. The computer systems include various computer system components including a Web browser and Web server. Each of the various components can be connected to the network, such as, for example, a Local Area Network ("LAN"), a Wide Area Network ("WAN"), or even the Internet. Thus, the various components can receive data from and send data to other components connected to the network. Accordingly, the components can create message related data and exchange message related data (e.g., Internet Protocol ("IP") datagrams and other higher layer protocols that utilize IP datagrams, such as, Transmission Control Protocol ("TCP"), Hypertext Transfer Protocol ("HTTP"), Simple Mail Transfer Protocol ("SMTP"), etc.) over the network. For example, components can exchange HTTP requests and responses and Simple Object Access Protocol ("SOAP") envelopes containing Web service related data.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A system for determining the thickness of a film, the system comprising:
   a substrate on which the film is deposited; and
   a fringing effect sensor, including:
      a driven electrode interposed between the substrate and the film;
      an electric potential source operably connected to the driven electrode such that an electric field is produced by the driven electrode;
      a sensing electrode interposed between the substrate and the film, the sensing electrode positioned such that a current is produced in the sensing electrode;

a measuring source operably connected to the sensing electrode so as to measure an admittance of the sensing electrode, wherein the admittance is related to a thickness of the film; and a data processor operably connected to the measuring source and configured to determine the thickness of the film according to the measured admittance and a predicted admittance, the predicted admittance being adjusted by a determined stray impedance value.

2. The system as defined in claim 1, wherein the fringing effect sensor is further configured to simultaneously determine dielectric characteristics of the film.

3. The system as defined in claim 1, wherein the fringing effect sensor is configured for placement within a human body.

4. The system as defined in claim 1, wherein the measuring source is integrated with the fringe effect sensor.

5. The system as defined in claim 1, wherein the data processor is integrated with the measuring source.

6. The system as defined in claim 1, wherein the film grows atop the fringe effect sensor.

7. The system as defined in claim 1, wherein the fringe effect sensor is configured for placement in an at least a partially enclosed volume.

8. The system as defined in claim 1, wherein the fringe effect sensor is positioned on one of the following: a flexible substrate; a substrate having a complex geometry, a movable substrate; and a non-planar substrate.

9. A method for determining the thickness of a film deposited on a substrate, the film and environment in which the film is disposed having differing dielectric permittivities, the method comprising:

by a driven electrode positioned at an interface of the film and the substrate, producing an electric field;

by a sensing electrode positioned the interface of the film and the substrate, measuring an electrical property related to the electric field and a thickness of the film; and calculating the thickness of the film by comparison of the measured electrical property with a predicted value of the electrical property, the predicted value of the electrical property being adjusted by a determined stray impedance value.

10. The method for determining as defined in claim 9, wherein the driven and sensing electrodes define a sensor, the sensor being positioned at the interface before growth of the film.

11. The method for determining as defined in claim 9, wherein the driven and sensing electrodes are positioned in a spatially periodic manner on the substrate.

12. The method for determining as defined in claim 9, wherein producing the electric field further comprises:

producing the electric field at a plurality of excitation frequencies.

13. The method for determining as defined in claim 12, further comprising:

producing the electric field at the plurality of excitation frequencies by varying the electric field sinusoidally.

14. The method for determining as defined in claim 9, wherein measuring the electrical property further comprises:

measuring an admittance of the sensor, the admittance relating to the film thickness.

15. The method for determining as defined in claim 9, further comprising:

simultaneously determining a dielectric permittivity of the film.

16. The method for determining as defined in claim 15, further comprising:

positioning a plurality of sensors at the interface to determine the film thickness and dielectric permittivity in multiple spatial interface locations, each sensor having uniform electrode spacing that differs from at least one other sensor;

using a first of the plurality of sensors having a first electrode spacing to determine the dielectric permittivity of the film at a first distance normal to the interface; and using a second of the plurality of sensors having a second electrode spacing to determine the dielectric permittivity of the film at a second distance normal to the interface.

17. In a film measurement system including a measuring instrument, a data processor and a sensor having a driven electrode and a sensing electrode positioned on a substrate, the electrodes including interdigitated conductive fingers, a method for measuring a thickness of a film deposited on the substrate, the film and substrate having differing dielectric permittivities, the method comprising:

estimating a stray impedance contribution with respect to the sensor;

determining a predicted admittance of the sensor;

adjusting the predicted admittance according to the stray impedance contribution;

the measuring instrument measuring an actual admittance of the sensor for at least one excitation frequency; and the data processor comparing the adjusted predicted admittance with the measured actual admittance to determine the film thickness.

18. The method for measuring as defined in claim 17, wherein comparing the adjusted predicted admittance further comprises:

determining a film thickness that minimizes the difference between adjusted predicted admittance and the measured actual admittance for the at least one excitation frequency.

19. The method for measuring as defined in claim 18, wherein determining the film thickness further comprises:

performing a least-squares estimate of the film thickness at a plurality of excitation frequencies.

20. The method for measuring as defined in claim 19, wherein performing the least squares estimate further comprises:

averaging the film thicknesses determined for the plurality of excitation frequencies.

21. The method for measuring as defined in claim 20, wherein measuring the actual admittance and comparing the adjusted predicted admittance are repeated to determine variability of the film thickness over time.

22. The method for measuring as defined in claim 21, wherein estimating the stray impedance, determining the predicted admittance, and adjusting the predicted admittance are performed before measuring the actual admittance.

23. The method for measuring as defined in claim 22, wherein estimating the stray impedance is performed with a film of known thickness.

24. The method for measuring as defined in claim 22, wherein estimating the stray impedance is performed before the film is present on the substrate.

25. The method for measuring as defined in claim 22, wherein estimating the stray impedance further comprises:

comparing a theoretical prediction of impedance of the sensor with a measured impedance of the sensor.

26. The method for measuring as defined in claim 22, wherein a second sensor is included on the substrate, the second sensor having a spacing between a driven electrode and a sensing electrode that is less than a measurement range of the film thickness, and wherein the method further comprises:

by the second sensor, measuring a dielectric permittivity of the film.

27. A method for determining the thickness of a film deposited on a substrate and interposed between the substrate and an environment, the film and environment having differing dielectric permittivities, the method comprising:

by a driven electrode positioned at an interface of the film and the environment, producing an electric field;

by a sensing electrode positioned the interface of the film and the environment, measuring an electrical property related to the electric field and a thickness of the film; and calculating the thickness of the film by comparison of the measured electrical property with a predicted value of the electrical property, the predicted value of the electrical property being adjusted by a determined stray impedance value.

28. The method for determining as defined in claim 27, wherein the driven and sensing electrodes are positioned in a spatially non-periodic manner on the substrate.

29. The method for determining as defined in claim 27, wherein producing the electric field further comprises:

producing the electric field at a plurality of pulsed or stepped excitation frequencies.

30. The method for determining as defined in claim 27, further comprising:

positioning a plurality of sensors at the interface to determine the film thickness, each sensor having addressable electrodes to selectively vary electrode spacing in determining the film thickness in multiple spatial interface locations.

31. The method for determining as defined in claim 30, further comprising:

using the plurality of sensors at the interface to simultaneously determine a dielectric permittivity of the film.

32. The method for determining as defined in claim 27, wherein the driven and the sensing electrodes are included in a hand-held device.

* * * * *